United States Patent [19]
Foreman

[11] Patent Number: 5,917,776
[45] Date of Patent: Jun. 29, 1999

[54] MEANS FOR REDUCING MINIMUM SENSING DISTANCE OF AN ULTRASONIC PROXIMITY SENSOR

[75] Inventor: Donald Sirola Foreman, Fridley, Minn.

[73] Assignee: Honeywell Inc., Minneapolis, Minn.

[21] Appl. No.: 08/778,006

[22] Filed: Dec. 31, 1996

[51] Int. Cl.⁶ ................................................. G01S 15/04
[52] U.S. Cl. ........................... 367/93; 340/568; 367/135; 367/137; 367/191
[58] Field of Search .............................. 367/93, 137, 135, 367/191; 340/568, 568.1

[56] References Cited

U.S. PATENT DOCUMENTS

| | | | |
|---|---|---|---|
| 3,821,834 | 7/1974 | McElroy | 29/25.35 |
| 4,596,006 | 6/1986 | Eder | 367/93 |
| 5,267,219 | 11/1993 | Woodward | 367/99 |

FOREIGN PATENT DOCUMENTS

| | | |
|---|---|---|
| 0144761 | 6/1985 | European Pat. Off. . |
| 9500862 | 1/1995 | WIPO . |

OTHER PUBLICATIONS

Object Detection Techniques Range from Limit Switches to Lasers, *Control Engineering* Nov. 1980, pp. 65–70.

Design and Characterization of a PVDF Ultrasonic Range Sensor, *IEEE Transactions on Ultrasonics, Ferroelectrics, and Frequency Control*, vol. 39, No. 6, Nov. 1992, pp. 688–692.

Texas Instruments data sheets, *Linear Integrated Circuits*, Sonar Ranging Receiver Type TL852, Nov. 1983.

Texas Instruments data sheets, *Linear Integrated Circuits*, Sonar Ranging Control Type TL851, Sep. 1983.

Texas Instruments data sheets, *Linear Integrated Circuits*, Sonar Ranging Control TL853, Dec. 1984.

Electronic Design & Packaging Company data sheets, SonaSwitch™ 1400, 1991.

Blătek, Inc. data sheets, 8000 Series, Model 8030–220 Air Coupled Transducer.

Projects Unlimited data sheets, Air Ultrasonic Ceramic Transducers, 1985.

Motorola data sheets, 45 Khz Transducer, 1988.

Reduced costs help ultrasonic sensors compete in position–detection systems, *Technology Update EDN*, Nov. 28, 1985.

*Primary Examiner*—Glen Swann
*Attorney, Agent, or Firm*—Ian D. Mackinnon

[57] ABSTRACT

A rugged ultrasonic sensor is provided which is capable of detecting objects in very close proximity to the sensor. This close proximity detection includes the detection of objects which are immediately adjacent the sensor housing. Such close range operation is achieved by tailoring the transducer to operate at previously undesirable conditions, including low Q and high frequency. Such operating conditions allow the resonating characteristics of the transducer not to interfere with close range operation.

12 Claims, 2 Drawing Sheets

MEANS FOR REDUCING MINIMUM SENSING DISTANCE OF AN ULTRASONIC PROXIMITY SENSOR

BACKGROUND OF THE INVENTION

The present invention relates to an ultrasonic sensor for use in detecting objects. More specifically, the ultrasonic sensor is utilized to detect both presence and range of objects in very close proximity to the sensor itself. Further, the sensor of the present invention can be used to detect objects immediately adjacent to the sensing surface of the sensor housing.

In automated industrial applications, sensors are used for numerous purposes. These purposes can include object detection during an automated manufacturing process, range detection during quality assurance checks, etc. In these industrial applications, it is necessary for these sensors to be very rugged, efficient and environmentally robust as the environments of use can be fairly harsh; the processes can be very dirty with particles of all types in the area of the sensor.

A common device for sensing the presence of objects is the use of eddy current killed oscillators (ECKOs). These devices have two shortcomings: (1) they can sense only metallic targets, and (2) they have very limited range relative to their physical size. For example, a maximum range of ⅓ the diameter of the sensor is common—a maximum range equal to the diameter of the sensor is achievable, however very unusual. Therefore, to perform sensing at any reasonable range would require a very large sensor (e.g. a range up to two (2) inches would require a sensor with a diameter of at least two (2) inches).

Ultrasonic sensing systems provide a much more efficient and effective method of longer range detection. These sensors require the use of a transducer to produce ultrasonic signals. These signals are propagated through a sensing medium and the same transducer can be used to detect returning signals. In most applications, the sensing medium is simply air. Several transducers are capable of accomplishing this function including piezoelectric polymer films such a polyvinylidene fluoride ($PVF_2$), and electrostatic transducers (such as those presently offered and used by the Polaroid Corporation).

Piezoceramic ultrasonic transducers are the transducers of choice for rugged, industrial applications because they are efficient and environmentally robust. These sensors have been used in industry for numerous applications; however have not been capable of short range object detection until recently. This is due to the inherent characteristics of present ultrasonic sensing systems.

Prior art piezoceramic ultrasonic transducers have been designed to have very good long range detection capabilities. In designing these sensors, it was always necessary to maximize the Q value of the transducer and minimize the frequency of operation. High Q amplifies the returning signal, and low frequency serves to reduce the attenuation of ultrasound in air because attenuation is a function of frequency. These prior art sensors, however, do not display the short range sensitivity required by the present invention.

It is well known by those skilled in the art that piezoceramic transducers have a ringing characteristic or resonant characteristic. More specifically, when the energizing signal for the transducer is removed, the device continues to resonate, albeit at a continuously decreasing amplitude, due to the resonant nature of the transducer itself. This ringing characteristic eliminates the ability to use ultrasonic transducers at very short ranges.

In operation, when the transducer is used in a sensing system, an electronic signal is provided to energize the transducer and consequently produce the ultrasonic signal. This energy is provided in a burst such that excitation is removed from the transducer at a point in time. When excitation is removed from the transducer, it is incapable of sensing any return signals created until the residual resonance (ringing) is damped below a level that returning signals would produce. As the objects being sensed creates reflections or returning signals, it is essential that the sensor be able to detect these signals. As is also well known in the art, when ultrasonic signals are transmitted through air their amplitude attenuates. In designing a sensing system using ultrasonic signals, it is therefore necessary to account for this attenuation when designing the sensitivity of the transducers (i.e. the system must be capable of detecting these attenuated return signals).

The operating range of an ultrasonic sensor is greatly affected by its ringing or resonating characteristics. When designing for close range sensitivity, the ring out time or standoff time (i.e. time required for residual resonance to degrade to an acceptable level) is directly determinative of short range operability. As will be further understood, a sensor must allow for this ringing to reach acceptable levels before the transducer is capable of sensing attenuated return signals. Consequently, short range detection has not been possible using present piezoceramic transducers.

SUMMARY OF THE INVENTION

This invention presents a piezoceramic sensing system capable of detecting the range and presence of objects in very close proximity to the sensor itself. Furthermore, by providing an acceptable setback, objects can be detected which are immediately adjacent to the sensor housing.

This short range operation is achieved through use of a piezoceramic transducer which is capable of operating at higher frequencies than previously thought usable in air. This higher frequency will help to minimize the transducer's ring-out time. Consequently, short range detection is thereby made possible.

Additionally, the present invention utilizes a housing or mounting which provides for a reasonable or practical recess of the transducer. As it is impossible to totally eliminate the ringing characteristic of the transducer, the present invention combines this practical recess along with a minimization of the ringing characteristics. These two factors, when combined, provide for a proximity sensor which is effective for close range detection while also being efficient and environmentally robust. Furthermore, the resulting sensor is of a reasonable size for use. In most industrial applications, it is desirable to utilize a sensor which is compact in size. This size constraint limits the type of sensors which are utilized for this application, especially when higher frequencies are used. As an example, an ultrasonic sensor constructed as taught herein can easily have the desired short-range properties while exhibiting a maximum range of many times its diameter.

It is an object of the present invention to provide a sensing system which is capable of detecting the presence and range of objects in close proximity to the sensor. This includes detection immediately adjacent to the sensor housing.

It is a further object of the present invention to provide an ultrasonic sensing system which is capable of operations in harsh environments. This object requires the use of transducers which are environmentally robust and very efficient.

It is an additional object of the present invention to fabricate a sensor for use in harsh environments which is small and compact in size while also being efficient for close proximity measurements.

It is a further object of the present invention to utilize a piezoceramic ultrasonic transducer which has a lower ring-out time than common. This lower ring-out time is achieved by operating the transducer at a frequency higher than normal while also minimizing the transducer's Q value.

It is another object of the present invention to provide an ultrasonic sensor for specific use in close proximity measurements. Such a specified application was achieved at the expense of long range sensitivity.

It is a yet an additional object of the present invention to provide a sensor which, while offering good short-range adjacent-object detection, can also provide a maximum range of several times its diameter.

BRIEF DESCRIPTION OF THE DRAWINGS

Further objects and advantages of the present invention will be seen by reading the following detailed description in conjunction with the drawings in which.

DETAILED DESCRIPTION OF THE INVENTION

Figure 1:
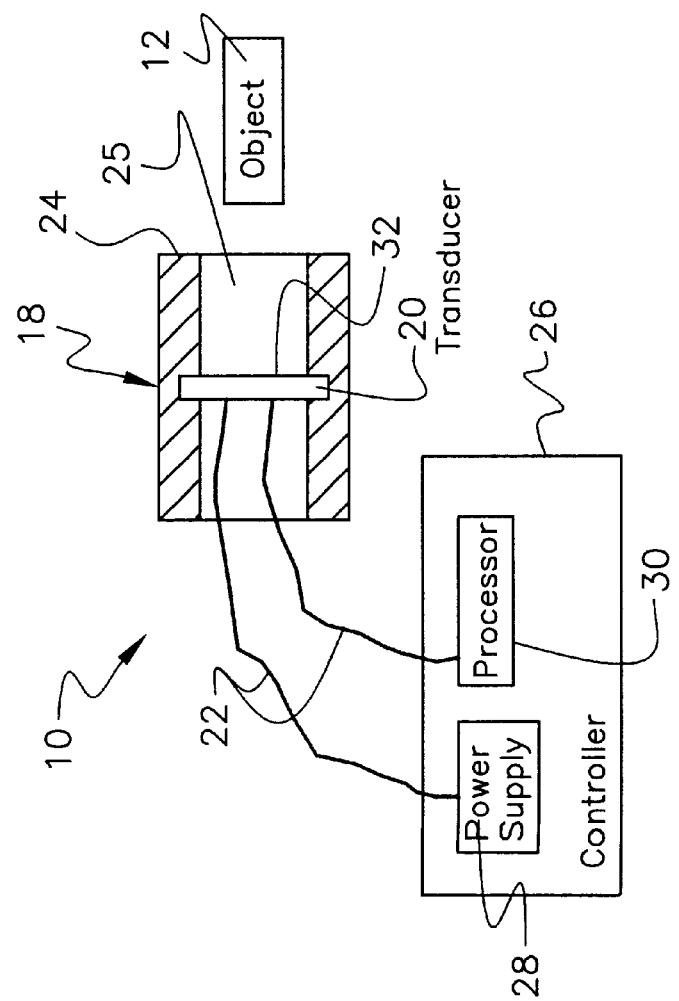
FIG. 1 is a block diagram of the piezoceramic sensing system.

Turning now to FIG. 1, there is shown a piezoceramic sensor 10 for determining the existence and range of an object 12 in close proximity to sensor 10. Object 12 can represent any object or device which is being sensed by the present invention. For example, this could include components of a manufacturing system, products on a production line, etc. Sensor 10 includes a sensor housing 18 and a transducer 20. Sensor housing 18 has an edge surface 24 on one end thereof. Extending inwardly from edge surface 24 is a recess 25. Transducer 20 is attached to housing 18 within recess 25. Connected to transducer 20 are connecting leads 22 for carrying signals to and from transducer 20. Electrical leads 22 are connected to a controller 26 which includes a power supplying device 28 and a processor 30. When excited with electrical energy, transducer 20 creates ultrasonic signals at an active surface 32 thereof.

Transducer 20 is a piezoceramic ultrasonic transducer. Piezoceramic ultrasonic transducers are the transducers of choice for rugged, industrial application because they are efficient and environmentally robust. Alternate transducers are possible—e.g., piezoelectric polymer films such as polyvinylidene fluoride (PVF2) and electrostatic transducers—however, these alternatives are fragile, and therefore are not suitable for very harsh environments.

Figure 2:
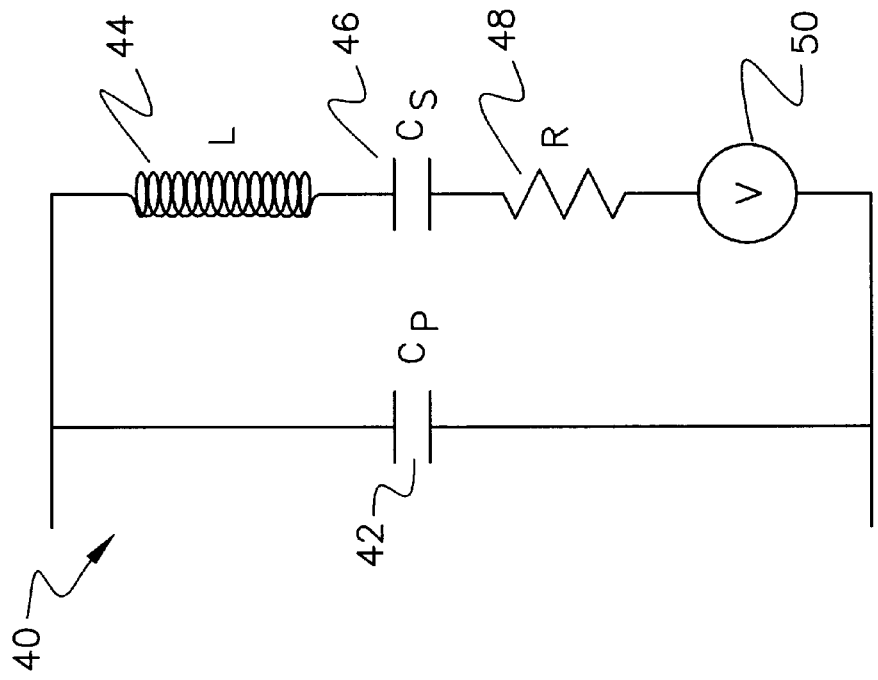
FIG. 2 is an equivalent circuit diagram of a piezoceramic ultrasonic transducer.

An electrical equivalent circuit 40 of piezoceramic ultrasonic transducer 10 is shown in FIG. 2. Referring specifically now to FIG. 2, there is shown a first capacitance 42, an inductance 44, a second capacitance 46, a resistance 48, and a voltage generator 50.

Inductance 44 and second capacitance 46 represent the series resonant mode of the transducer. At a frequency slightly above the series resonant frequency, first capacitance 42 resonates with the transducers inductive reactance (presented by the series combination of inductance 44 and a second capacitance 46) to produce a parallel resonance. Resistance 48 is the dissipative element—that part which actually converts electrical current to ultrasound, and therefore consumes power from the energizing circuit. Voltage generator 50 is a voltage source which represents voltage generated by the transducer when sound from the environment impinges upon the transducer. Such sound may result from an echo of a previously-emanated sound, returning from an object in proximity to the transducer.

When a piezoceramic ultrasonic transducer is excited with a burst of electrical energy, it produces and emanates a burst of ultrasonic energy. When the excitation is abruptly removed, such transducers typically have the property of ringing for a time because they are resonant entities.

There are numerous ways to excite the transducer of the present invention. Obviously, the transducer can be driven at a predetermined frequency. This predetermined frequency may be near the resonant frequency of the transducer, or may be at another frequency which is chosen for some purpose. Alternatively, the transducer could be "hit" with a pulse of energy, this would cause the transducer to ring at it's resonant frequency. Additionally, the transducer could be driven by an unstable control circuit, which would naturally resonate at the circuits resonant frequency. In all of these alternatives, the transducer will create the desired ultrasonic signals and the drive can be stopped at some point in time.

Figure 3:
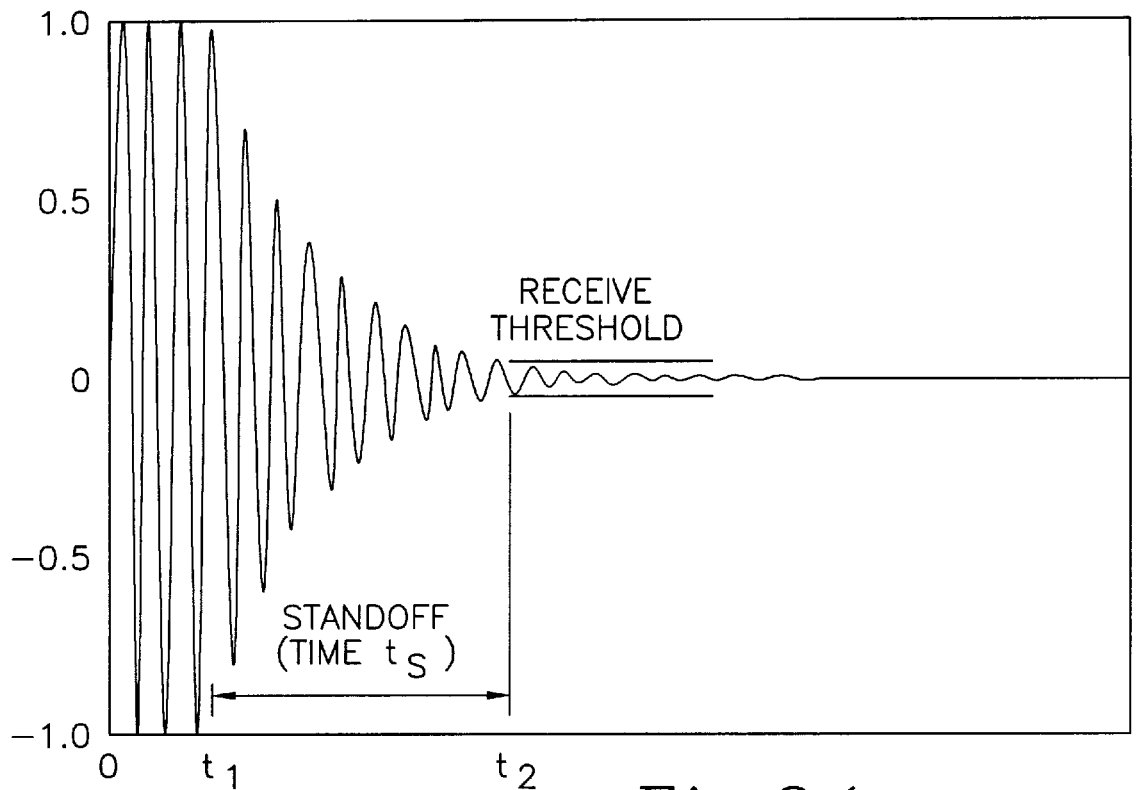
FIG. 3 is a graphical diagram illustrating the ringing characteristics of prior art transducers.

The voltage observed on a prior art ultrasonic transducer when excited by a burst of electrical energy is depicted by FIG. 3. After excitation is removed, the transducer continues to ring, as depicted in FIG. 3. More specifically, at time $t_1$, energy is removed from transducer 20. The voltage across transducer 20, however, does not immediately drop to zero due to the resonant nature of this device. Instead, the amplitude of the voltage across transducer 20 drops as an exponentially damped sinusoid.

As is well known in the art, a returning sound or acoustic signal will cause a voltage $V_r$ to be generated across transducer 20. As previously mentioned, this returning signal will be considerably attenuated due to its transmission through air and further due to the fact that not all sound emanated will be reflected by the target, and not all sound reflected by the target will impinge upon the transducer The return signal $V_r$, developed by returning sound, will be smaller in magnitude than the excitation voltage due to losses and attenuation of sound during the round-trip from transducer 20, to object 12, to transducer 20. There is a period of time termed the standoff period (shown as period $t_1$ to $t_2$ in FIG. 3) and labeled as "standoff time", or $t_s$, where the return signal would be obscured by the residual ringing of the transducer. When the ringing voltage has diminished below the level of the expected return or voltage $V_r$, the returning signals may be reliably detected. More specifically, when the ringing voltage has diminished below a predetermined threshold level, $V_{th}$, return signals can then be detected. The threshold level is chosen to be somewhat below the level of the expected return voltage $V_r$ to assure detection.

Traditional ultrasonic proximity detectors and range finders have a standoff period ts which corresponds to a standoff distance of several inches. The standoff distance is the distance below which a target cannot be detected because its return is obscured by the residual ringing of the transducer. The standoff distance is correlated to the standoff period by the velocity of sound as follows:

$$Ds = \frac{1}{2}ct_s,$$

where:

$D_s$ is the standoff distance, c is velocity of sound, and $t_s$ is the standoff period as defined.

As is obvious from the above equation, if standoff period ts can be minimized, then standoff distance can also be minimized. In a proximity sensor, zero standoff distance is often desirable—but a zero standoff ultrasonic sensor using a rugged piezoceramic transducer has not been accomplished by prior art systems.

One method of achieving zero standoff is to recess transducer 20 within sensor housing 18. As previously mentioned, it is often desirable to create sensors which are small in size. Consequently, large recesses are also impractical as the housing or package size would become too large. Therefore, using a recessed transducer does not fully solve the problem; however, when coupled with other methods of reducing standoff distance, a practical and operable sensor is achieved.

If the standoff distance can be reduced to the point where it can be accommodated by practical recess of the transducer from the physical face of the sensor, then the zero standoff goal is realized. In one embodiment of the invention, practical means less than 0.5 inches. The several inches of standoff distance displayed by prior art sensors has made this goal impossible to reach.

The standoff period $t_s$ is governed by both the Q and the operating frequency (f) of the transducer. As Q is reduced and f is increased, standoff time ts is consequently reduced. As is well known, Q is roughly the ratio of the reactance of inductor 44 (at operating frequency) to resistance 48 in the equivalent circuit.

Sensitivity and maximum range are served by having high Q and low f, and that has been an objective of prior-art ultrasonic proximity sensors and range finders. High Q amplifies the returning signal, and low f serves to reduce the attenuation of ultrasound in air because attenuation is a function of frequency. Prior art sensors have not recognized the merit of zero standoff distance because of the previous concerns for maximum range, and none have displayed the desirable and beneficial attribute of zero standoff distance.

To achieve the zero standoff objective of the present invention, a transducer is employed that displays the previously thought undesirable attributes of low Q and higher-than-usual-frequency. Generally, this results in relatively high frequencies. These high frequencies often exceed 750 KHz. Using this type of transducer, standoff time $t_s$ can be reduced to a point where zero standoff distance can be achieved. Lowering the Q increases the percentage by which the ringing amplitude decreases each cycle, and raising the frequency decreases the time from cycle-to-cycle; both of these operate to decrease the length of time until the ringing has decayed to a given level. In one embodiment of the present invention, the desired operating frequency is greater than 750 kHz.

Figure 4:
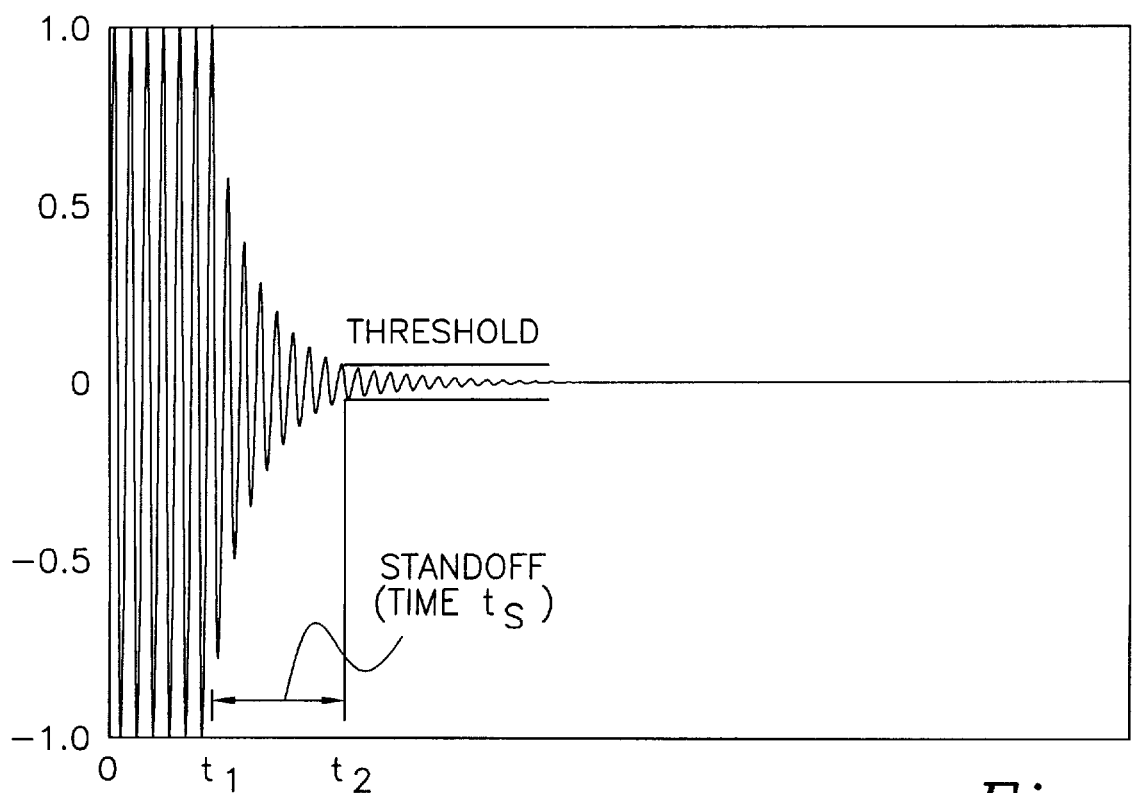
FIG. 4 is a graphical diagram illustrating the ringing and sensitivity characteristics of the transducer of the present invention.

Referring now specifically to FIG. 4 (and in comparison with FIG. 3), there is shown an illustration of the ringing characteristics of the present invention. As can be seen, the frequency of excitation is much higher. Also, the standoff time ts is greatly reduced. As previously mentioned, standoff time is a controlling factor in the sensor s operability at close range. Because standoff time of the present invention is greatly reduced, the sensor is much more effective and efficient at close range.

As may be expected, the maximum range of the sensor of the present invention is also greatly reduced from that exhibited by previous ultrasonic sensors, none of which could achieve zero-standoff distance, but significantly superior to that exhibited by ECKO sensors of comparable size Having illustrated and described the principles of the invention in the preferred embodiment, it should be apparent to those skilled in the art that the invention can be modified in arrangement and detail without departing from such principles. We claim all modifications coming within the scope and spirit of the following claims.

It is claimed:

1. An ultrasonic sensor for use in determining the presence of objects in close proximity to the sensor, including objects immediately adjacent the sensor and objects a distance of several times the sensor's diameter away, the sensor comprising:

a transducer for producing an ultrasonic signal mounted within a housing, wherein the transducer has a preselected standoff time while operating at a relatively high preselected frequency, the transducer being directly aligned with an object to be detected and positioned a minimum distance from the nearest possible position of the object to be detected wherein the minimum distance is greater than a distance the ultrasonic signal will travel during one-half of the preselected standoff time;

a power supply for providing energy to the transducer at the preselected frequency such that the transducer is energized by a burst of power suitable for the transducer; and processing means attached to the transducer for recognizing signals detected by the transducer following the preselected standoff time.

2. The sensor of claim 1 wherein the transducer is a piezoceramic ultrasonic transducer, the transducer having a preselected ringing characteristic which determines the preselected standoff time at the preselected frequency.

3. The sensor of claim 1 wherein the preselected frequency is greater than 750 KHz.

4. The sensor of claim 1 wherein the sensor further comprises a sensor housing for holding the transducer such that the transducer is recessed from an edge surface of the housing, the recess being equal in distance to the minimum distance, thus allowing the sensor to detect the object when it is immediately adjacent to the sensing surface.

5. The sensor of claim 1 wherein the burst of power causes the transducer to resonate at the preselected frequency.

6. An ultrasonic sensor for use in determining the presence of objects in close proximity to the sensor, including objects immediately adjacent the sensor and objects a distance of several times the sensor's diameter away, the sensor comprising:

a piezoceramic transducer for producing an ultrasonic signal at an active surface when energized, and for detecting ultrasonic signals at the active surface when not energized, wherein the piezoceramic transducer has a preselected ringing characteristic which includes a preselected standoff time while operating at a relatively high predetermined frequency;

a housing for holding the piezoceramic transducer such that the active surface of the transducer is directly aligned with the object to be detected and is recessed a minimum distance in relation to a edge surface of the housing wherein the minimum distance is greater than a distance the ultrasonic signal will travel during one-half of the preselected standoff time;

a power supply attached to the piezoceramic transducer for energizing the piezoceramic sensor with a burst of energy suitable for the transducer at the predetermined frequency; and sensing means attached to the piezoceramic transducer for determining when the piezoceramic transducer has detected an ultrasonic signal, wherein the burst of energy and the preselected ringing characteristics are related to allow detection of objects at the edge surface of the housing.

7. The sensor of claim 6 wherein the preselected ringing characteristic at the predetermined frequency causes attenuation below a threshold level in the preselected standoff time.

8. The sensor of claim 7 wherein the predetermined frequency is greater than 750 KHz.

9. The sensor of claim 7 wherein the preselected ringing characteristic is an exponentially damped sinusoid which attenuates below the threshold level in the preselected standoff time, the preselected standoff time being less that the amount of time for an acoustic signal to complete a round trip between the active surface and a plane in juxtaposition with the edge surface.

10. An ultrasonic sensor for use in determining the presence of objects in close proximity to the sensor, including objects immediately adjacent the sensor and objects a distance of several times the sensor's diameter away, the sensor comprising:

a sensor housing having an edge surface;

a piezoceramic transducer mounted within the sensor housing, the piezoceramic transducer having an active surface for producing ultrasonic signals in response to electrical excitation and for producing detection signals in response to external ultrasonic signals, the active surface being positioned within the housing such that a recess of a minimum distance exists between the edge surface and the active surface the piezoceramic transducer having a preselected ringing characteristic which is dependent upon the electrical characteristics of the transducer which includes a preselected standoff time while operating at a relatively high predetermined frequency, wherein the minimum distance is greater than a distance the ultrasonic signal will travel during one-half of the preselected standoff time;

a power supply attached to the piezoceramic transducer for providing electrical excitation for a predetermined excitation time; and a signal detector attached to the piezoceramic transducer for determining the presence of detection signals, wherein the sensor is capable of detecting the detection signals a preselected standoff time after the predetermined excitation time.

11. The sensor of claim 10 wherein the preselected standoff time is determined by the ringing characteristics and the resonant frequency of the piezoceramic transducer.

12. The sensor of claim 11 wherein the resonant frequency is greater than 750 KHz.

* * * * *